United States Patent
Jang et al.

(10) Patent No.: US 8,392,662 B2
(45) Date of Patent: Mar. 5, 2013

(54) METHODS OF DATA MANAGEMENT IN NON-VOLATILE MEMORY DEVICES AND RELATED NON-VOLATILE MEMORY SYSTEMS

(75) Inventors: Jun-Ho Jang, Gyeonggi-do (KR); Jin-Hwa Lee, Gyeonggi-do (KR); Woon-Jae Chung, Gyeonggi-do (KR); Sang-Hoon Choi, Seoul (KR); Nam-Hoon Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 478 days.

(21) Appl. No.: 12/483,001

(22) Filed: Jun. 11, 2009

(65) Prior Publication Data

US 2009/0310412 A1    Dec. 17, 2009

(30) Foreign Application Priority Data

Jun. 17, 2008    (KR) ........................ 10-2008-0056980

(51) Int. Cl.
*G06F 12/00* (2006.01)
(52) U.S. Cl. .................... 711/135; 711/134; 711/170
(58) Field of Classification Search .............. 711/133, 711/134, 135, 170, 173
See application file for complete search history.

(56) References Cited

U.S. PATENT DOCUMENTS

| | | | |
|---|---|---|---|
| 5,404,485 A | 4/1995 | Ban | |
| 6,381,176 B1 | 4/2002 | Kim et al. | |
| 7,277,982 B2 * | 10/2007 | Calvignac et al. | 711/105 |
| 7,529,879 B2 | 5/2009 | Kim et al. | |
| 2004/0024971 A1 * | 2/2004 | Bogin et al. | 711/135 |
| 2006/0004971 A1 * | 1/2006 | Kim et al. | 711/154 |
| 2006/0059297 A1 * | 3/2006 | Nakanishi et al. | 711/103 |
| 2006/0136687 A1 * | 6/2006 | Conley et al. | 711/162 |
| 2007/0283086 A1 * | 12/2007 | Bates | 711/113 |
| 2008/0120488 A1 * | 5/2008 | Woo et al. | 711/209 |
| 2008/0282025 A1 * | 11/2008 | Biswas et al. | 711/103 |

FOREIGN PATENT DOCUMENTS

| | | |
|---|---|---|
| JP | 2003-022687 | 1/2003 |
| KR | 1019990013057 A | 2/1999 |
| KR | 1020070014470 A | 2/2007 |
| WO | WO 2007/037757 A1 | 4/2007 |

* cited by examiner

*Primary Examiner* — Jared Rutz
*Assistant Examiner* — Gurtej Bansal
(74) *Attorney, Agent, or Firm* — Myers Bigel Sibley & Sajovec, P.A.

(57) ABSTRACT

A data management method includes assigning data buffered in a first memory device into at least two different groups for transfer to a second memory device. At least one of the different groups has at least two units of the data assigned thereto. The data is transferred from the first memory device to the second memory device in a sequence according to a respective priority associated with each of the different groups and in group-by-group manner such that units of the data assigned to a group having a higher priority are transferred to the second memory device prior to units of the data assigned to a group having a lower priority. Related systems and methods are also discussed.

18 Claims, 10 Drawing Sheets

METHODS OF DATA MANAGEMENT IN NON-VOLATILE MEMORY DEVICES AND RELATED NON-VOLATILE MEMORY SYSTEMS

CROSS-REFERENCE TO RELATED APPLICATION

This U.S. non-provisional patent application claims priority under 35 U.S.C. §119 from Korean Patent Application No. 10-2008-0056980 filed on Jun. 17, 2008, the disclosures of which is hereby incorporated by reference herein in its entirety.

BACKGROUND

The present invention relates to non-volatile memory systems. More particularly, the present invention relates to methods of data management in non-volatile memory systems.

Flash memory is widely used in computers, memory cards, and the like. As the use of portable information devices such as cellular phones, PDA, digital cameras, and the like has become more widespread in recent years, flash memories have been used as a storage device to replace traditional hard disks. The above-described mobile devices may require mass storage devices in order to provide various functions (e.g., to record and/or playback full motion video). To satisfy such requirements, multi-bit memory devices have been developed which store 2 or more data bits in one memory cell. A memory cell storing multi-bit data may be called a Multi-Level Cell (MLC), whereas a memory cell storing 1-bit data may be called a Single-Level Cell (SLC). In the case of a flash memory device adopting an MLC configuration, the usable capacity may be increased, while the time taken to write data may also be increased. In contrast, in a flash memory device adopting an SLC configuration, the usable capacity may be relatively low as compared to an MLC flash memory device, while the time taken to write data may be relatively short as compared to an MLC flash memory device. That is, a flash memory device adopting the SLC configuration may operate at a relatively high speed as compared with a flash memory device adopting the MLC configuration. Further, hybrid NAND flash memory devices have been developed, which may be capable of selectively using MLC or SLC memory cells. In particular, some devices may include an SLC memory chip and an MLC memory chip in a single package for performance improvement and cost saving. For example, a device may include both a relatively high-speed and high-priced non-volatile memory (e.g., SLC) and a relatively low-speed and low-priced non-volatile memory (e.g., MLC). In such a device, performance may be affected by a data writing method and a data managing method. In general, a non-volatile memory whose write speed is relatively fast may be frequently updated, and relatively small-size hot data may be recorded in the non-volatile memory. The reduced performance and/or erase count limitations of a non-volatile memory of a relatively slow write speed may be complemented by non-volatile memory of a relatively rapid write speed.

Due to advances in MLC technology, 3-bit and 4-bit MLC memories have been developed. But, problems may arise when the number of bits stored in one memory cell is increased. For example, an erase count of a non-volatile memory may be decreased.

As compared with other memories, flash memory may offer advantages such as a relatively rapid read speed at a relatively low cost. However, an erase operation may be conducted prior to writing data in a flash memory, and a unit of data to be written (or programmed) is typically less than a unit of data to be erased. Such characteristics may make it difficult to use a flash memory as a main memory. Further, such characteristics may obstruct direct use of a file system for hard disk when a flash memory device is used as an auxiliary storage device. Accordingly, a Flash Translation Layer (FTL) may be utilized to provide compatibility between a file system and a flash memory. The FTL may perform a role of mapping a logical address generated by a file system to a physical address of a flash memory to be erased. A representative FTL technique may be a log block mapping technique. The log block mapping technique may be a block mapping method using a limited number of log blocks as a write buffer. The above-described address mapping function of FTL may enable a host to recognize a flash memory as a hard disk drive (or SRAM). This means that a flash memory may be accessed in the same manner as a hard disk drive from the host's perspective.

One function of a FTL may be related to mapping techniques. Examples of mapping techniques are disclosed in U.S. Pat. No. 5,404,485 entitled "FLASH FILE SYSTEM"; U.S. Pat. No. 6,381,176 entitled "METHOD OF DRIVING REMAPPING IN FLASH MEMORY AND FLASH MEMORY ARCHITECTURE SUITABLE THEREFOR"; and U.S. Pat. No. 7,529,879 entitled "INCREMENTAL MERGE METHODS AND MEMORY SYSTEMS USING THE SAME," the disclosures of which are incorporated by reference herein.

SUMMARY

Embodiments of the present invention provide data management methods that may increase the speed and/or life of a memory system that includes different non-volatile memories.

According to some embodiments, a method of managing data in a memory system including a first memory device and a second memory device includes programming data in the first memory device by a predetermined unit of data. For example, the data may be configured for transfer by units of sectors. A plurality of data programmed in the first memory device is flushed into at least one log block of the second memory device in a group-by-group manner according to a flush sequence wherein ones of the plurality of data are assigned to at least two different groups having different respective flush priorities. At least one of the different groups has at least two units of the plurality of data assigned thereto.

In some embodiments, the plurality of data may be a plurality of sector data, and one or more of the plurality of sector data may be included in one of the different groups according to a logical sector number thereof. For example, ones of the plurality of sector data included in a same group may have logical sector numbers corresponding to a same data block of the second memory device.

In some embodiments, the respective flush priorities of the different groups in the flush sequence may be determined according to how many ones of the plurality of sector data are included in each of the different groups. Also, each of the plurality of sector data included in a same group may have a respective priority associated therewith according to a logical sector number thereof.

In some embodiments, a respective flush priority of at least one of the different groups in the flush sequence may be determined according to a data block of the second memory device to which the at least one log block is assigned at a time that the respective flush priority is determined. For example, a group including at least one of the plurality of sector data having a logical sector number corresponding to the data block of the second memory device may have a highest priority in the flushing sequence, and may be the first group that is flushed into the second memory device.

According to further embodiments, a data flushing method in a memory system which transfers a plurality of sector data buffered in a first memory device into a second memory device includes selecting one of the plurality of sector data for transfer to the second memory device, and detecting at least an additional one of the plurality of data having a same target block of the second memory device as the selected one of the plurality of data. The selected and detected ones of the plurality of sector data are shifted into a log block of the second memory device that is assigned to the target block prior to shifting remaining ones of the plurality of data.

In some embodiments, the plurality of data may be a plurality of sector data, and the selected and detected ones of the plurality of sector data may be sequentially shifted into the log block in a sequence such that sector data having a lower logical sector number is shifted first. The steps of selecting, detecting, and shifting may be repeated until the plurality of sector data buffered in the first memory device is transferred into the second memory device.

In some embodiments, the selected one of the plurality of data may be a first one of the plurality of data according to a buffering sequence of the first memory device.

According to still further embodiments, an information processing system includes a first memory device that is configured to sequentially store data provided from a host device by a sector unit, a second memory device that is configured to store a plurality of sector data transferred thereto from the first memory device, and a controller that is configured to provide an interface between the host and the first and second memory devices. The controller is configured to flush the plurality of sector data from the first memory device into the second memory device in a group-by-group manner according to a flush sequence wherein ones of the plurality of sector data are assigned to different groups having different respective flush priorities. At least one of the different groups has at least two units of the plurality of data assigned thereto.

In some embodiments, the first and second memory devices may be included in a non-volatile memory card.

In some embodiments, data in the second memory device may be managed according to a log block mapping method, and the controller may be configured to flush the plurality of sector data into at least one log block of the second memory device.

In some embodiments, ones of the plurality of data may be assigned to the different groups according to a data block size of the second memory device.

In some embodiments, a group including a greater number of the ones of the plurality of data may have a higher flush priority in the flush sequence.

In some embodiments, a group including at least one of the plurality of data having a logical sector number corresponding to a data block of the second memory device to which the at least one log block of the second memory device is assigned may have a highest priority in the flushing sequence, and may be flushed first by the controller.

In some embodiments, a group including a greater number of the ones of the plurality of data has a lower flush priority in the flush sequence.

In some embodiments, the controller may be a host driver that is configured to assign the ones of the plurality of data into the different groups having the respective flush priorities.

In some embodiments, the controller may be a memory controller including a flash translation layer that is configured to assign the ones of the plurality of data into the different groups having the respective flush priorities. The flash translation layer may determine a respective flush priority of at least one of the different groups according to a data block of the second memory device to which the at least one log block of the second memory is assigned at a time that the respective flush priority is determined by the flash translation layer.

In some embodiments, the first memory device may be a single-level flash memory device, and the second memory device may be a multi-level flash memory device.

According to yet further embodiments, in a data management method, data buffered in a first memory device is assigned into at least two different groups for transfer to a second memory device. At least one of the different groups has at least two units of the data assigned thereto. The data is transferred from the first memory device to the second memory device in a sequence according to a respective priority associated with each of the different groups and in a group-by-group manner such that units of the data assigned to a group having a higher priority are transferred to the second memory device prior to units of the data assigned to a group having a lower priority.

In some embodiments, a respective priority of each of the different groups is based on a number of units of the data assigned thereto.

In some embodiments, units of the data assigned to a same group comprise logical sector numbers that correspond to a same data block of the second memory device.

In some embodiments, the data may be transferred to at least one log block of the second memory device. A respective priority of at least one of the different groups may be determined based on a data block of the second memory device to which the at least one log block is assigned at a time that the respective priority is determined. For example, a group including data having a logical sector number corresponding to a data block of the second memory device to which the at least one log block is assigned may have a highest priority.

DETAILED DESCRIPTION OF THE EMBODIMENTS

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

As described herein, a system including SLC and MLC memory devices may be used as a specific example of a memory system having different memory regions in order to describe properties and functions in accordance with some embodiments. Further, the exemplary embodiments may be described herein with reference to a sector unit as the predetermined unit of data to be transferred. However, a page unit or other inherent data transfer unit of a non-volatile memory device may also be used as the unit of data to be transferred. Other aspects may be easily understood by one skilled in the art. Also, different memory regions may include different types of non-volatile memories. For example, some embodiments of the invention may provide a memory system which includes different types of memory devices such as PRAM and flash memory, NOR flash memory and NAND flash memory, and the like.

Figure 1:
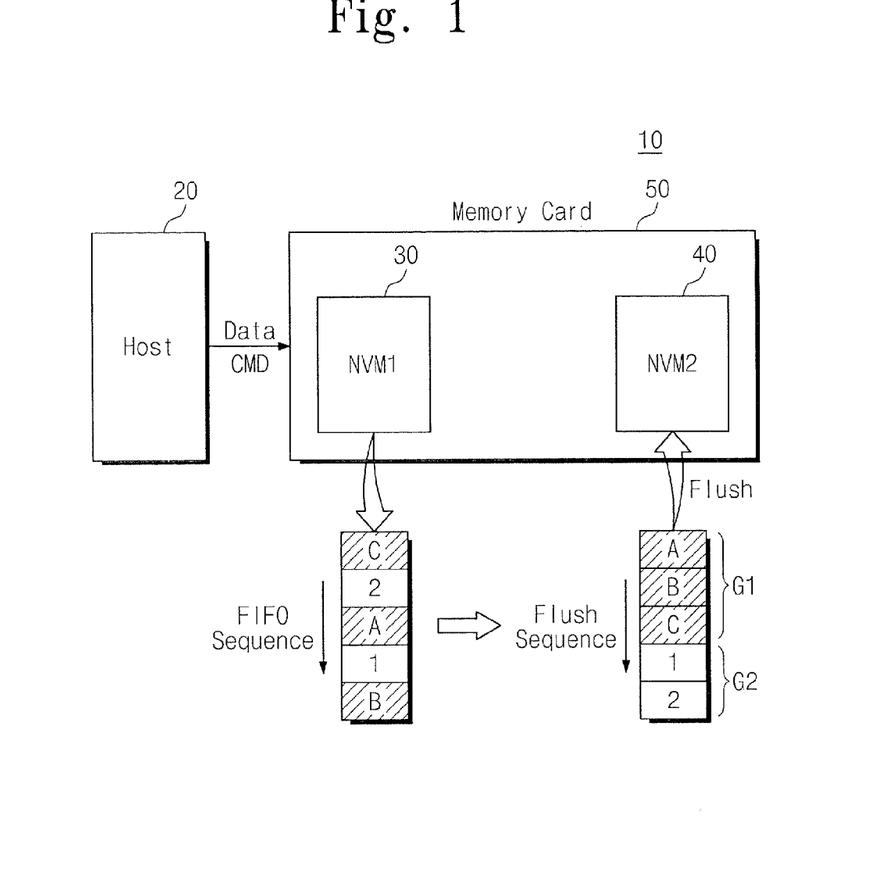
FIG. 1 is a block diagram illustrating a data flush operation according to some embodiments.

FIG. 1 is a block diagram illustrating a data flush operation according to some embodiments. Referring to FIG. 1, an information processing system 10 may include a host 20 and a memory card 50. The memory card 50 responds to a command CMD from the host 20 to store data from the host 20 in a first non-volatile memory module 30. During a flush operation, the memory card 50 rearranges sector data C, 2, A, 1, and B sequentially stored in the first non-volatile memory 30 so as to be divided into groups G1 and G2, and stores the groups G1 and G2 of the sector data in a second non-volatile memory module 40.

The host 20 is a device which uses the memory card 50 as a storage device. For example, the host 20 may be a personal computer, a digital camera, PDA, and/or a portable media reproducing device. The host 20 may execute a user application program and a host driver. The user application program may perform a specific function indicated by a user. The host driver interfaces the host 10 and the memory card 50 according to a given protocol when the user application program writes data to or reads data from the memory card 50. Most systems may use hard disk drive (HDD) as a mass storage device. Accordingly, data transferred to the memory card 50 from the host 20 may be transferred according to a manner applied to the HDD, for example, in a sector unit. The host 20 may control data transfer within the memory card 50 using logical sector numbers, each of which correspond to sector data. Accordingly, the host 20 may perform grouping and rearranging operations for the sector data by controlling logical sector numbers. However, the memory card 50 may perform sector grouping and rearranging operations instead of the host 20 in some embodiments.

The memory card 50 may include the first and second non-volatile memories 30 and 40. Data from the host 20 may be stored sequentially in the first non-volatile memory 30. During a flush operation, data stored in the first non-volatile memory 30 may be "flushed" into the second non-volatile memory 40. As used herein, a "flushing" operation refers to copying or relocating units of data from one of the first and second memories 30 and 40 to the other. In some embodiments, a log block mapping method (also referred to as a "log mapping technique") may be used for address mapping in the memory card 50. However, if data is flushed in the same order as the sectors were input into the first non-volatile memory 30, an excessive number of merge operation may be caused between log blocks of the second non-volatile memory 40. Accordingly, some embodiments of the present invention may reduce the number of merge operations and/or erase counts below that which may be possible via a host driver of the host 20 or a flash translation layer FTL of a conventional memory card 50. In particular embodiments, sector data C, 2, A, 1, and B input in the first non-volatile memory 30 in a FIFO manner may be divided into groups G1 and G2. The groups G1 and G2 of sector data may be flushed into the second non-volatile memory 40 group-by-group according to a respective priority associated therewith, which may reduce the number of merge operations performed to transfer the data to the second non-volatile memory 40. A memory card using a log block mapping method is described herein by way of example, but embodiments of the invention may be applied to memory cards using other address mapping methods.

Figure 2:
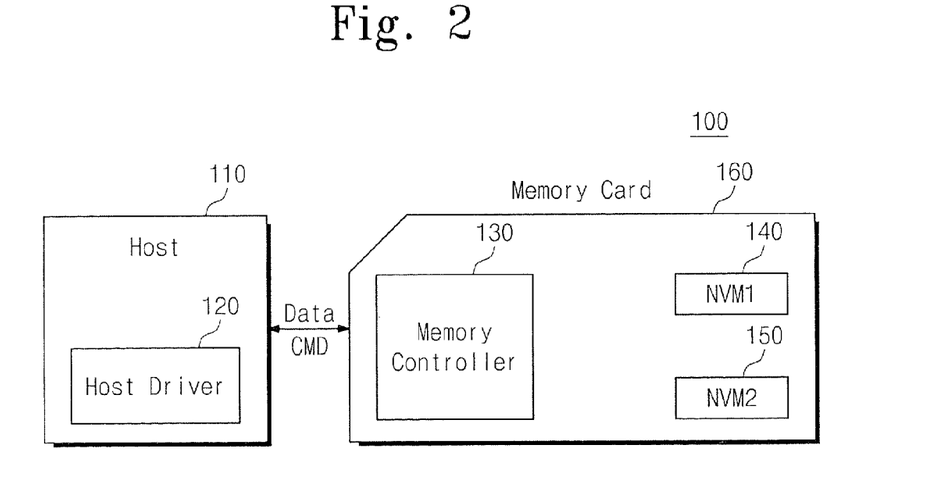
FIG. 2 is a block diagram illustrating an information processing system according to some embodiments.

FIG. 2 is a block diagram illustrating an information processing system according to some embodiments. FIG. 2 shows an exemplary embodiment where a host driver 120 of a host 100 performs operations for rearranging sector data into groups having different priorities.

As shown in FIG. 2, the host driver 120 may interface with a memory card 160 according to a given protocol when a user application program writes data in the memory card 160. The host driver 120 may be provided as a driver of the host 110 to support interfacing with the memory card 160. However, such a function may be implemented by hardware in some embodiments. The host driver 120 may manage data from the memory card 160 in units of sectors, also referred to herein as a sector unit. The host driver 120 may add a logical sector number to each sector so as to support data exchange of a sector unit. However, the host driver 120 may not consider hardware information in the memory card 160. For example, the host driver 120 may provide data without considering states related to an erase count, a merge mapping manner, an address mapping manner, wear leveling, and the like. Accordingly, the host driver 120 may not know a sector number of each memory block in the first and second non-volatile memories 140 and 150, a data block number corresponding to a current log block, and the like. Thus, the host driver 120 is able to group sector data to be flushed by a logic sector number, for example, by a $40^{th}$ unit or a $50^{th}$ unit. In particular, if sector data is grouped by a $40^{th}$ unit, sector data corresponding to logical sector numbers between a $0^{th}$ sector and a $39^{th}$ sector may be grouped. Likewise, all sectors corresponding to logical sector numbers between a $40^{th}$ sector and a $79^{th}$ sector may constitute another group. A sector size determining a maximum size of one group may be defined on the basis of a block size of the second non-volatile memory 150. If such information is not obtained by the host driver 120, a maximum size of one group may be determined by a default value set in the host driver 120.

The host driver 120 may classify logical sector numbers for sector-unit data to be flushed into a plurality of groups. The classified groups may have different flush priorities based upon the number of included sector-unit data. Further, sector data in the same group may be flushed in different priorities according to logical sector numbers. Data flush policy to be conducted under the control of the host driver 120 according to some embodiments is as follows:

(1) group logical sector numbers and/or grant priority to a transfer of data for a relatively large group (or, a group having a higher number of allotted sectors);
(2) transfer data in a FIFO manner where data is to be transferred between groups having the same size or number of included sectors;
(3) transfer sector data having a lower sector number first where data is to be transferred among sectors of the same group.

The memory card 160 may transfer data buffered in the first non-volatile memory 140 into the second non-volatile memory 150 according to a transfer order determined by the host driver 120. The memory controller 130 may control data exchange between the memory card 160 and the host 110. The first non-volatile memory 140 may be a memory device or a memory region having a relatively rapid write speed, such as an SLC memory device. The second non-volatile memory 150 is used as a mass storage medium, and data buffered in the first non-volatile memory 140 may be transferred to the second non-volatile memory 150 in a flush operation. The second non-volatile memory 150 is not limited to any specific address mapping method; however the second non-volatile memory 150 is described herein using a log block mapping method by way of example. Also a flush operation is described herein under the assumption that logic sector numbers of the host driver 120 are controlled. However, the invention is not so limited, and embodiments of the invention may include controlling an input order from the host 110 to the first non-volatile memory 130 so as to be transferred in an order grouped by the host driver 120. Flushing of data from the first non-volatile memory 140 to the second non-volatile memory 150 is described in greater detail below.

Figure 3:
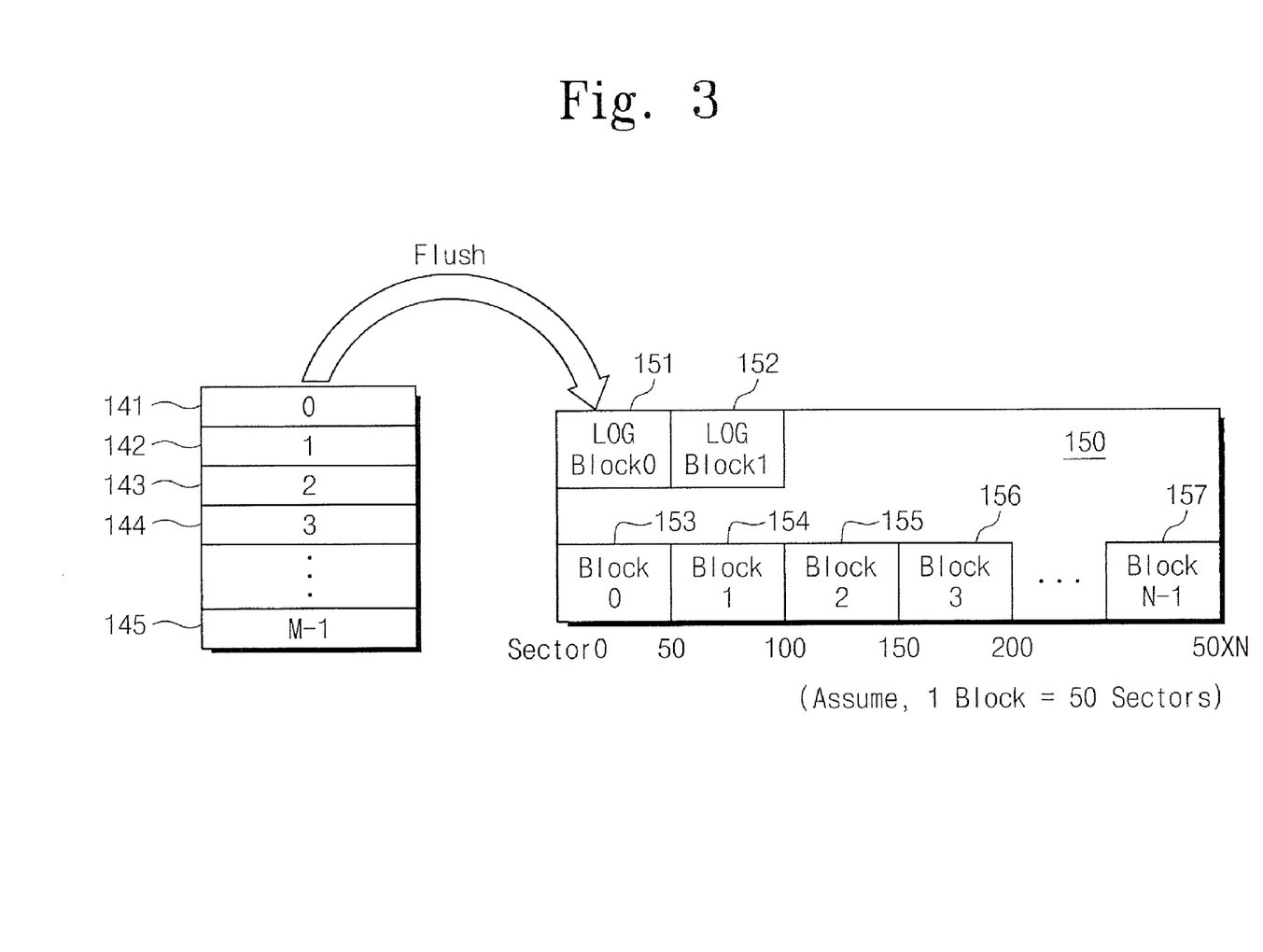
FIG. 3 is a block diagram illustrating a flush method of FIG. 2.

FIG. 3 is a block diagram illustrating a flush method as described above with reference to FIG. 2. In the embodiments of FIG. 3, the first non-volatile memory 140 is an SLC flash memory, and the second non-volatile memory 150 is an MLC flash memory.

The first non-volatile memory 140 may have a rapid write speed. Thus, input data may be rapidly stored in the first non-volatile memory 140. In general, host data such as meta data which is frequently updated may be stored using the first non-volatile memory 140, which may function as a write buffer. A data region of the first non-volatile memory 140 may be arranged so as to sequentially program a plurality of sectors. Data input from a $0^{th}$ sector region 141 to an $(M-1)^{th}$ sector region 145 may be sequentially programmed. Each of the sector regions 141 to 145 is not overwritten. Data may be flushed from the first non-volatile memory 140 to the second non-volatile memory 150 at a time when all sector regions 141 to 145 are filled with input data.

Data in the second non-volatile memory 150 may be managed by a memory block unit according to a log block mapping method. The second non-volatile memory 150 may include log blocks 151 and 152, which may function as a buffer, and data blocks 153-157, where valid data from log blocks are transferred. Although not shown in figures, free blocks each indicating an erased memory block may be further included, and may be allotted to log blocks as needed.

A flush operation may proceed as follows. In the following example, each data block of the second non-volatile memory 150 has 50 sectors. Accordingly, sector data may be grouped by a $50^{th}$ unit. In a case where sector data is grouped by a $50^{th}$ unit, sector data between a $0^{th}$ sector and a $49^{th}$ sector may constitute one group. And, sector data between a $50^{th}$ sector and a $99^{th}$ sector may constitute another group.

Data transferred from the first non-volatile memory 140 in a flushing operation may be first programmed in any one of log blocks 151 and 152. In case of the exemplary embodiments, flush data may be transferred by a plurality of group units. For grouping, memory cells in the same group are defined with reference to a size of a data block of the second non-volatile memory 150. For example, assume that sectors having logical sector numbers 1, 34, 159, 160, 188, and 144 are flushed. Sectors 1 and 34 correspond to a $0^{th}$ block 153 of the second non-volatile memory 150. Sectors 159, 160 and 188 correspond to a $3^{rd}$ block 156 of the second non-volatile memory 150. Sector 144 corresponds to a $2^{nd}$ block 155. Thus, in accordance with the data flush policy of the host driver 120, sectors 159, 160, and 188 corresponding to the $3^{rd}$ data block are selected as the first group (Group1), which includes the greatest number of sectors. Sectors 1 and 34 are selected as the second group (Group2), while sector 144 is selected as the third group (Group3), which includes the least number of sectors. The flush operation may be conducted starting with the first group (Group1).

As understood from the above description, the host driver 120 may group logical sector numbers and set priorities. In a flush operation, data buffered in the first non-volatile memory 140 may be transferred to the second non-volatile memory 150 according to the grouped logical sector numbers and the set priorities via the host driver 120. In other words, the data buffered in the first non-volatile memory device 140 may be flushed in a group-by-group manner such that ones of the data assigned to a group having a higher priority are transferred to the second memory device 150 prior to ones of the data assigned to a group having a lower priority.

Figure 4:
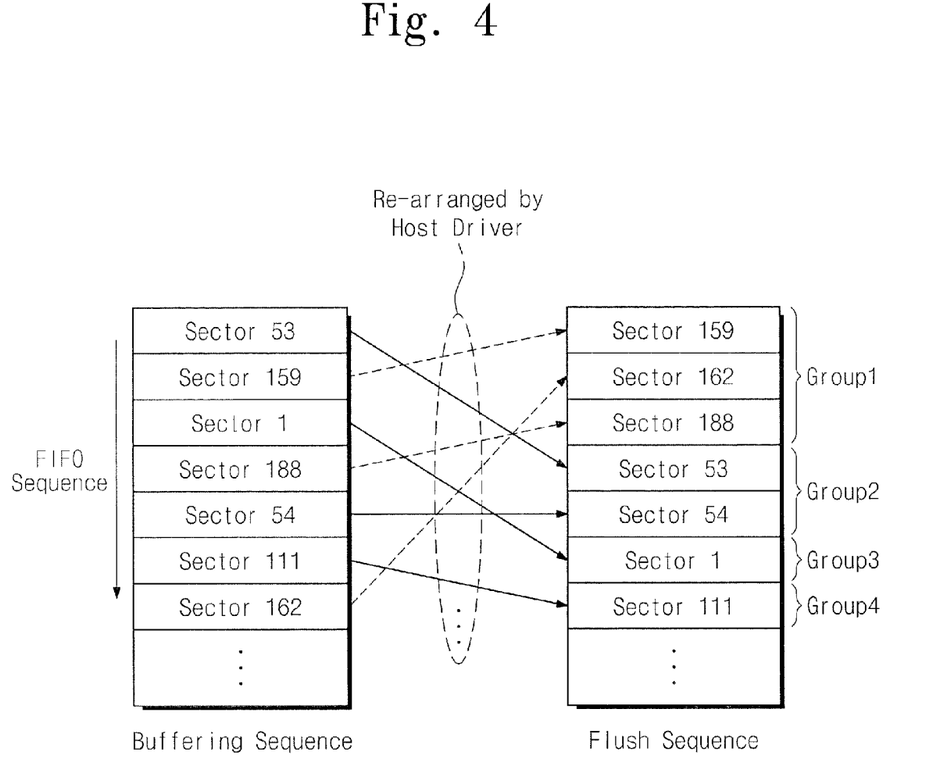
FIG. 4 is a block diagram illustrating grouping of logical sector numbers via a host driver in FIG. 2.

FIG. 4 is a block diagram illustrating groupings of logical sector numbers via the host driver of FIG. 2. Sectors may be buffered in the first non-volatile memory 140 in the following order: 53, 159, 1, 188, 54, 111, and 162. Sectors 159, 162, and 188 are assigned or allotted to Group1 by the host driver 120. Sectors 53 and 54 are allotted to Group2. Only one sector is included in Group3, but the sector having a lower logical sector number (sector 1 in this case) is allotted thereto. A last sector 111 is allotted to Group4. The first group (Group1) may be flushed first. Within each of the groups Group1 to Group4, a sector having a relatively low sector number has a higher priority as compared with a sector having a relatively high sector number. Accordingly, sectors may be rearranged in this flush order of 159, 162, 188, 53, 54, 1, and 111 to provide a flush sequence that is different from the buffering sequence in the first memory device.

Rearrangement of the flush order may be conducted by the host driver 120. Sector data may be transferred from the first non-volatile memory 140 to the second non-volatile memory 150 according to the rearranged flush order. Accordingly, as shown in FIG. 4, groups that include more sectors have a higher flush priority, and the lower-numbered sectors within each group have a higher flush priority.

Figure 5A:
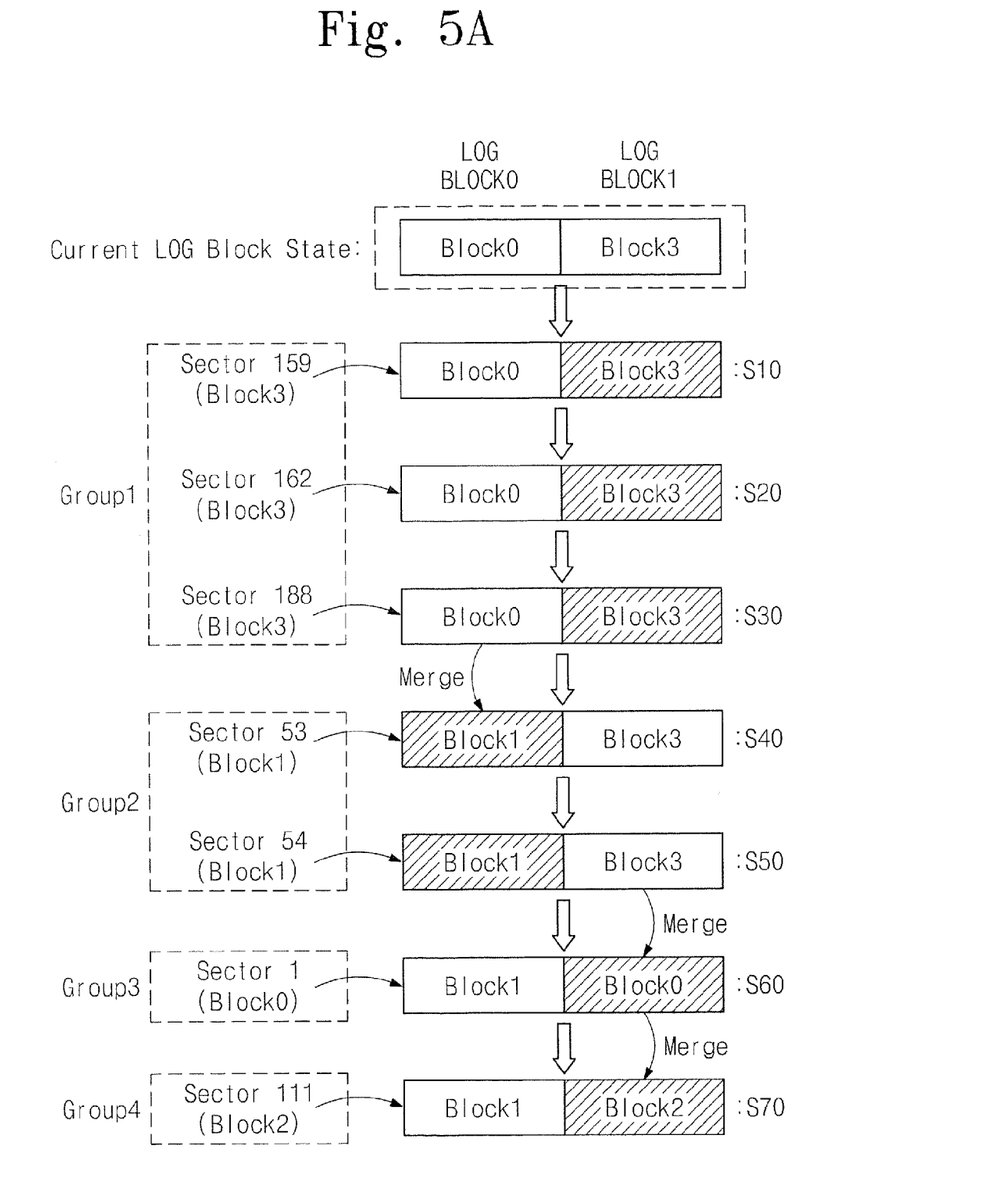
FIG. 5A is a diagram illustrating a flush procedure according to some embodiments based on the groupings of FIG. 4.

FIG. 5A is a diagram illustrating a flush procedure according to some embodiments. Referring to FIG. 5A, there are illustrated log blocks LOG BLOCK0 and LOG BLOCK1 and flush data provided by a sector unit. In this example, it is assumed that a current log block LOG BLOCK0 is allotted to a data block Block0 and a log block LOG BLOCK1 is allotted to a data block Block3. Hatched blocks indicate log blocks where transferred sector data is programmed. A block number recorded in each log block corresponds to a number of a data block to which a log block is allotted. At this state, a flush operation is sequentially conducted from sectors of a group including more sector numbers to sectors of a group including fewer sector numbers. The flush operation is described in greater detail below.

First, a sector 159 of the first group Group1 is shifted from the first non-volatile memory 140 to the second non-volatile memory 150 according to priorities indicated by the flush sequence arranged or assigned via the host driver 120. The sector 159 may correspond to a data block Block3 where sectors corresponding to logical sector numbers 150 to 199 of the second non-volatile memory 150 are stored. Since a log block LOG BLOCK1 is allotted or allocated to the data block Block3, the sector 159 may be programmed in the log block LOG BLOCK1 (S110). Then, a sector 162 of the first group Group1 is shifted from the first non-volatile memory 140 to the second non-volatile memory 150. The sector 162 corresponds to the data block Block3 where sectors corresponding to logical sector numbers 150 to 199 are stored. Since the log block LOG BLOCK1 is allotted to the data block Block3, a sector 162 is programmed in the log block LOG BLOCK1 (S20). Then, a sector 188 of the first group Group1 is transferred from the first non-volatile memory 140 to the second non-volatile memory 150. The sector 188 is included in the data block Block3 where sectors corresponding to logical sector numbers 150 to 199 are stored. Since the log block LOG BLOCK1 is allotted to the data block Block3, the sector 188 is programmed in the log block LOG BLOCK1 (S30). When flush data of a sector unit included in one group is shifted, a merge operation is not performed since in additional log block is not alotted.

Following the data transfer of the data from the first group Group1, a data flush operation is performed for sectors 53 and 54 of the second group Group2. A sector 53 is transferred from the first non-volatile memory 140 to the second non-volatile memory 150. The sector 53 corresponds to a data block Block1 where sectors corresponding to logical sector numbers 50 to 99 of the second non-volatile memory 150 are stored. However, neither of the log blocks LOG BLOCK 0 and LOG BLOCK1 are allotted to the data block Block1. Thus, a merge operation is conducted to secure an erased block as a log block. In particular, one erased free block is secured by merging a data block Block0 and a log block LOG BLOCK0 allotted to a current data block Block0. The secured free block is assigned to a log block LOG BLOCK0, which is allotted to a data block Block1. An input sector 53 is programmed in a log block LOG BLOCK0 allotted to a data block Block1 (S40). Then, a data transfer operation of the second group Group2 is completed by programming a sector 54 included in the same group as the sector 53 in a log block LOG BLOCK0 without a further merge operation (S50).

Following the transfer of data from the second group Group2, a data flush operation is performed for sector 1 corresponding to the third group Group3. Sector 1 corresponds to a data block Block0 where sectors corresponding to logical sector numbers 0 to 49 of the second non-volatile memory 150 are stored. However, as no log block is currently allotted to the data block Block0, an erased block may be secured as a log block via a merge operation. In particular, one erased free block is obtained by merging a data block Block3 and a log block LOG BLOCK1 allotted to a current data block Block3. The obtained free block is assigned to a log block LOG BLOCK1, which is allotted to a data block Block0. Data transfer of the third group Group3 is completed by programming an input sector 1 in a log block LOG BLOCK1 (S60).

Following the data transfer from the third group Group3, a data flush operation is performed for sector 111 corresponding to the fourth group Group4. Sector 111 corresponds to a data block Block2 where sectors each corresponding to logical sector numbers 100 to 149 of the second non-volatile memory 150 are stored. However, as no log block is currently allotted to the data block Block2, an erased block may be secured as a log block via a merge operation. An erased free block is obtained by merging a data block Block0 and a log block LOG BLOCK1 allotted to a current data block Block0. The obtained free block is assigned to a log block LOG BLOCK1, which is allotted to a data block Block2. Data transfer of the fourth group Group4 is completed by programming an input sector 111 in a log block LOG BLOCK1 (S70).

In accordance with the flush operation according to some embodiments, a merge operation may not be required when sector data in the same group is transferred. A merge operation occurs at a point of time when erased log blocks are required between groups. That is, if a flush operation is conducted with respect to four groups, log blocks are obtained via three-time merge operations. As a result, it is possible to reduce the frequency of obtaining or securing a new log block by grouping of flush data. Thus, the number of merge operations and erase counts may be reduced.

Figure 5B:
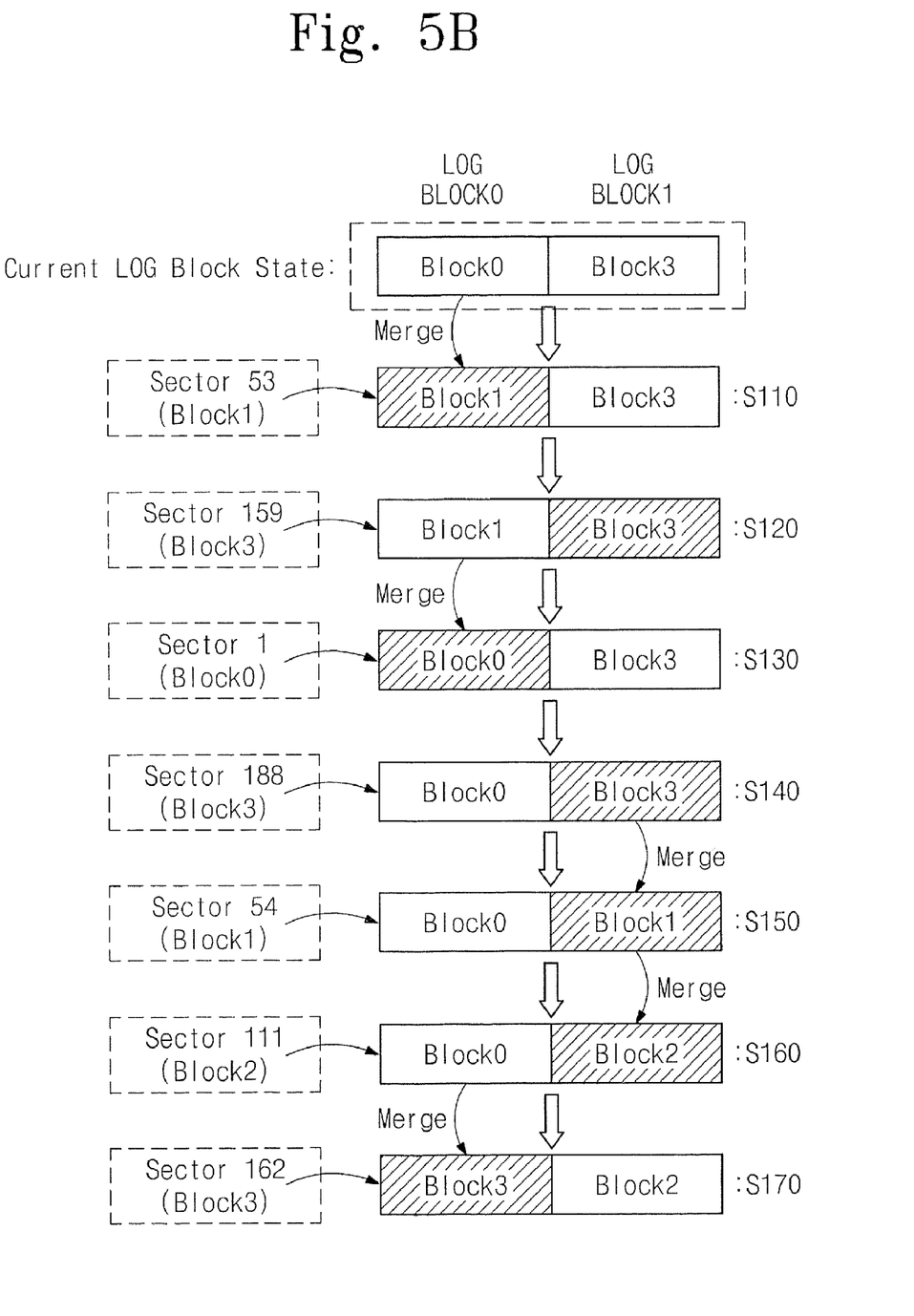
FIG. 5B is a diagram illustrating a FIFO flush procedure.

FIG. 5B is a diagram illustrating a flush procedure that is performed according to a FIFO manner. Referring to FIG. 5B, there are illustrated log blocks LOG BLOCK0 and LOG BLOCK1 of the second non-volatile memory 150 and flush data provided by a sector unit. In this example, it is assumed that a current log block LOG BLOCK0 is allotted to a data block Block0 and a log block LOG BLOCK1 is allotted to a data block Block3. At this state, flush data of the first non-volatile memory 140 may be transferred to the second non-volatile memory 150 in an input order of the first non-volatile memory 140. Such a flush operation is described in greater detail below.

A sector 53 first input to the first non-volatile memory 140 is transferred to the second non-volatile memory 150 at step S110. Sector 53 corresponds to a data block Block1 where sectors corresponding to logical sector numbers 50 to 99 of the second non-volatile memory 150 are stored. But, since no log block is currently allotted to the data block Block1, a log block LOG BLOCK0 is merged with a data block Block0. A free block obtained via the merge operation may be assigned to a log block LOG BLOCK0, which is allotted to a data block Block1. Once a log block LOG BLOCK0 has been allotted to a data block Block1, sector 53 is programmed in the log block LOG BLOCK0 (S110). Then, sector 159 is shifted or transformed from the first non-volatile memory 140 to the second non-volatile memory 150. Sector 159 corresponds to a data block Block3 where sectors corresponding to logical sector numbers 150 to 199 of the second non-volatile memory 150 are stored. Since a log block LOG BLOCK1 is allotted to a data block Block3, the sector 159 is programmed in a log block LOG BLOCK1 without a merge operation (S120). Then, sector 1 is shifted or transferred from the first non-volatile memory 140 to the second non-volatile memory 150. Sector 1 corresponds to a data block Block0 where sectors corresponding to logical sector numbers 0 to 49 of the second non-volatile memory 150 are stored. However, no log block is currently allotted to a data block Block0. As such, a log block LOG BLOCK0 allotted to a data block Block1 is merged with a data block Block1. A free block obtained via the merge operation is assigned to a log block LOG BLOCK0, which is allotted to a data block Block0. Once a log block LOG BLOCK0 has been allotted to a data block Block0, sector 1 is programmed in the log block LOG BLOCK0 (S130). Data transfer for sector 188 may be conducted at step S140. Sector 188 corresponds to a data block Block3 where sectors corresponding to logical sector numbers 150 to 199 of the second non-volatile memory 150 are stored. Since a log block LOG BLOCK1 is allotted to a data block Block3, the sector 188 is programmed in a log block LOG BLOCK1 without a merge operation (S140).

Data transfer for sector 54 may be conducted at step S150. Sector 54 corresponds to a data block Block1 where sectors corresponding to logical sector numbers 50 to 99 of the second non-volatile memory 150 are stored. As no log block is currently allotted to a data block Block0, a log block LOG BLOCK1 allotted to a data block Block3 is merged with a data block Block3. An erased free block obtained via a merge operation is assigned to a log block LOG BLOCK1, which is allotted to a data block Block1. Once a log block LOG BLOCK1 allotted to a data block Block1 is obtained, sector 54 is programmed in a log block LOG BLOCK1 (S150). Then, data transfer of sector 111 is performed at Step S160. Sector 111 corresponds to a data block Block2 where sectors corresponding to logical sector numbers 100 to 149 of the second non-volatile memory 150 are stored. As no log block is currently allotted to a data block Block2, a log block LOG BLOCK1 allotted to a data block Block1 is merged with a data block Block1. A free block obtained via a merge operation is assigned to a log block LOG BLOCK1, which is allotted to the data block Block2. Once the log block LOG BLOCK1 allotted to the data block Block2 is obtained, sector 111 is programmed in the log block LOG BLOCK1 (S160). Data transfer of sector 162 is performed at step S170. Sector 162 corresponds to a data block Block3 where sectors corresponding to logical sector numbers 150 to 199 of the second non-volatile memory 150 are stored. As no log block is currently allotted to a data block Block3, a log block LOG BLOCK0 allotted to a data block Block0 is merged with a data block Block0. A free block obtained via a merge operation is assigned to a log block LOG BLOCK0, which is allotted to a data block Block3. Once the log block LOG BLOCK0 has been allotted to data block Block3, sector 162 is programmed in the a log block LOG BLOCK0 (S170). Thus, according to the data flush operation of FIG. 5B, which is executed without grouping and/or priority rearrangement of the data to be flushed, merge operations are more frequently used to obtain free blocks. In particular, as shown in FIG. 5B, five merge operations are performed. As such, an erase count may be increased and a write speed may be reduced.

However, as shown in FIG. 5A, a flush operation according to some embodiments of the invention may perform only three merge operations, rather than the five merge operations performed in the FIFO flush operation of FIG. 5B where flush data is not grouped and a priority order is not rearranged. Accordingly, in some embodiments of the present invention, it may be possible to reduce an erase count and/or improve a write speed by grouping logical sector numbers of flush data and/or rearranging a priority order via the host driver 120.

Figure 6:
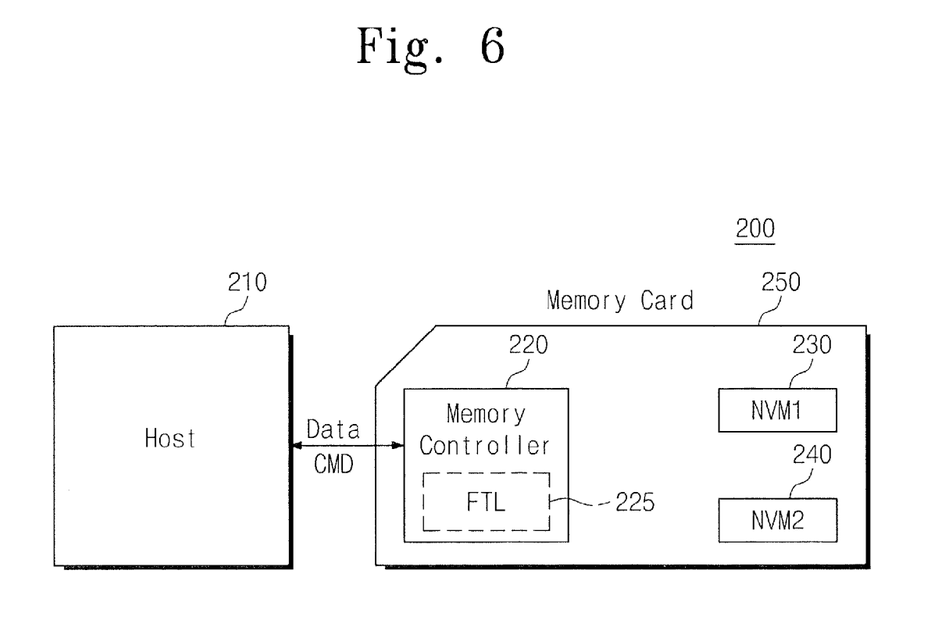
FIG. 6 is a block diagram illustrating an information processing system including a flash translation layer supporting grouping and a flush operation according to some embodiments.

FIG. 6 is a block diagram illustrating an information processing system including a flash translation layer that supports grouping and flushing operations according to some embodiments. Referring to FIG. 6, grouping and rearranging of flush data may be performed by a memory card 250 instead of a host 210. The memory card 250 includes a memory controller 220 which is configured to interface between the memory card 250 and the host 210. Further, the memory controller 220 may include a flash translation layer (FTL) 225 as one of constituent elements or functions of the memory controller 220. In such an information processing system 200, flush data grouping and rearranging may be performed by the memory controller 220, and in particular, by the FTL 225.

In some embodiments of FIG. 6, the host 210 may not perform a flush data grouping operation and/or a priority rearranging operation. Accordingly, control operations based on logical sector numbers may not be performed by the host 210. Rather, sector data and write commands may be sent to the memory card 250 in a general manner.

The memory card 250 may include a memory controller 220 having the configuration or function of the FTL 225, the first non-volatile memory 230, and the second non-volatile memory 240. Configurations and/or operations of the first and second non-volatile memories 230 and 240 may be similar to those discussed with reference to FIG. 2. However, the memory controller 220 may further perform functions such as the above-described grouping and rearranging operations. In particular, the FTL 225 may perform a flash data grouping operation and a priority rearranging operation. Since the FTL 225 may also perform an address mapping operation and/or functions such as wear leveling, garbage collection, and the like, the host 210 may not obtain overall information of the memory card 250 in real time. Accordingly, it may be effective to perform a flush data grouping operation and/or a priority rearranging operation via the FTL 225, which has access to information specific to the memory card 250, such as the number of sectors per block, the currently allotted or assigned log block numbers, and the like. A data flush policy performed by the FTL 225 of FIG. 6 is as follows:

(1) group data to be flushed that is stored in the first non-volatile memory 230 by units of sectors and determine a size of each group based on the number of sectors per block of the second non-volatile memory 240;

(2) first transfer data capable of being stored in a log block allotted to the second non-volatile memory 240 among the groups;

(3) grant priority to a group having a higher number of sectors assigned thereto except where a group is capable of being stored in a currently allotted log block;

(4) transfer data in a FIFO manner in a case where groups have the same size or number of included sectors;

(5) grant priority to sector data having a lower logical sector number as compared with sector data having a higher logical sector number.

In accordance with the flush policy of the FTL 225 of FIG. 6, data of a group which is able to be programmed in a currently allotted log block is transferred first.

Figure 7:
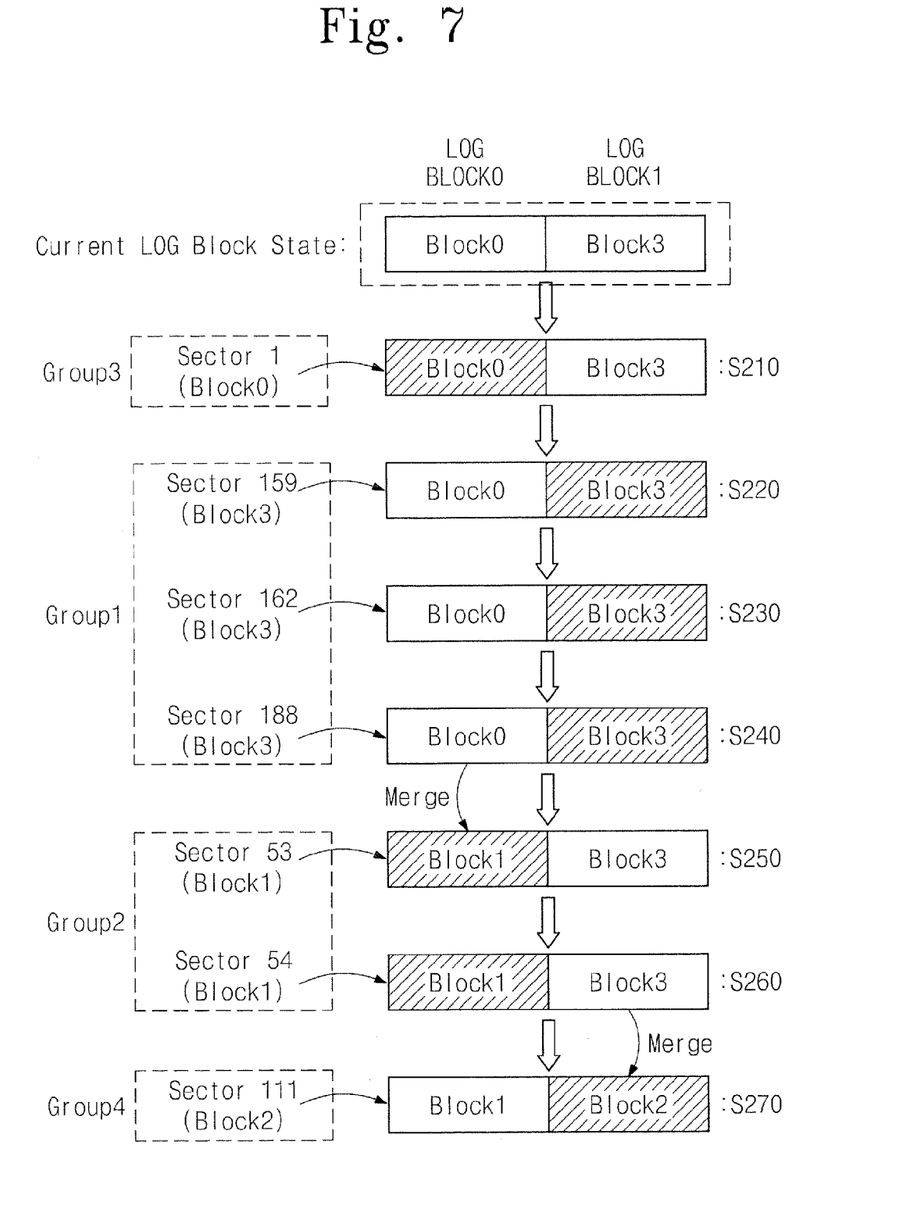
FIG. 7 is a diagram illustrating a flush procedure performed by the flash translation layer in FIG. 6.

FIG. 7 is a diagram illustrating a flush procedure performed via the flash translation layer 225 of FIG. 6. Referring to FIG. 7, in the second non-volatile memory 240, a log block LOG BLOCK0 and a log block LOG BLOCK1 are allotted to a data block Block0 and a data block Block3, respectively, by FTL 225. Under this condition, the FTL 225 divides flush data into a plurality of sector groups based on the size of a memory block of the second non-volatile memory 240. The plurality of sector groups including the flush data therein may be the same as the sector groups illustrated in FIG. 4. However, flushing priority among the groups may be determined differently from the flush procedure of FIG. 5A. The FTL 225 may have access to overall allocation information for a current log block. Accordingly, the FTL 225 may determine a priority with respect to each of sector groups based on the numbers of the data blocks to which current log blocks have been allotted or assigned. That is, sector groups which correspond to a data block Block0 and/or a data block Block3 are transferred first, because a log block LOG BLOCK0 is currently allotted to the data block Block0 and a log block LOG BLOCK1 is currently allotted to the data block Block3. The flush procedure of FIG. 7 is described in greater detail below.

First a sector group corresponding to a data block Block0 (to which log block LOG BLOCK0 is currently allotted), may be the third group Group3. Thus, sector 1 of the third group Group3 may be programmed in log block LOG BLOCK0 of the second non-volatile memory 240 without a merge operation (S210).

At step S220, a sector group corresponding to a data block Block3 (to which log block LOG BLOCK1 is currently allotted) is transferred from the first memory 230 to the second memory sector group corresponding to data block Block3 may be the first group Group1. Accordingly, sectors 159, 162, and 188 of the first group Group1 may be programmed sequentially in log block LOG BLOCK1 of the second non-volatile memory 240 without a merge operation (S220, S230, S240).

Upon transfer of the data from the first group Group1, data from the second group Group2 is transferred according to the flush policy where a higher priority is granted to a group including a greater number of sectors. Sectors 53 and 54 of the second group Group2 correspond to a data block Block1 of the second non-volatile memory 240. However, since none of the current log blocks LOG BLOCK0 and LOG BLOCK1 are allotted to a data block Block1, an erased block for a log block is secured via a merge operation. An erased free block is obtained by merging a log block LOG BLOCK0 and a data block Block0. The obtained free block is assigned to a log block LOG BLOCK0, which is allotted to a data block Block1. The input sector 53 may then be programmed in log block LOG BLOCK0 allotted to a data block Block1 (S250). Data transfer from the second group Group2 is completed by programming sector 54 in log block LOG BLOCK0 without a further merge operation (S260).

After sectors in the second group Group2 are shifted, a sector 111 in the fourth group Group4 may be transferred. The sector 111 corresponds to a data block Block2 of the second non-volatile memory 240. However, the log blocks LOG BLOCK0 and LOG BLOCK1 are currently allotted to data blocks Block1 and Block3, respectively. Since no log blocks are currently allotted to data block Block2, an erased block is secured as a log block via a merge operation. The FTL 225 may obtain an erased free block by merging a log block LOG BLOCK1 and a data block Block3. The obtained free block is assigned to a log block LOG BLOCK1, which is allotted to a data block Block2. Data transfer from the fourth group Group4 including sector 111 thereby is completed (S270).

In accordance with the flush operation managed by the FTL 225 described in FIG. 7, flush operations for four sector groups Group1 to Group4 may require two merge operations, because a priority is determined by the FTL 225 based on the current allocation of the log blocks. As a result, a merge operation is not performed until after the first two groups are transferred. As compared with the flush procedure described in FIG. 5A, the number of required merge operations is reduced due to the grouping and priority determination performed by the FTL 225.

Figure 8:
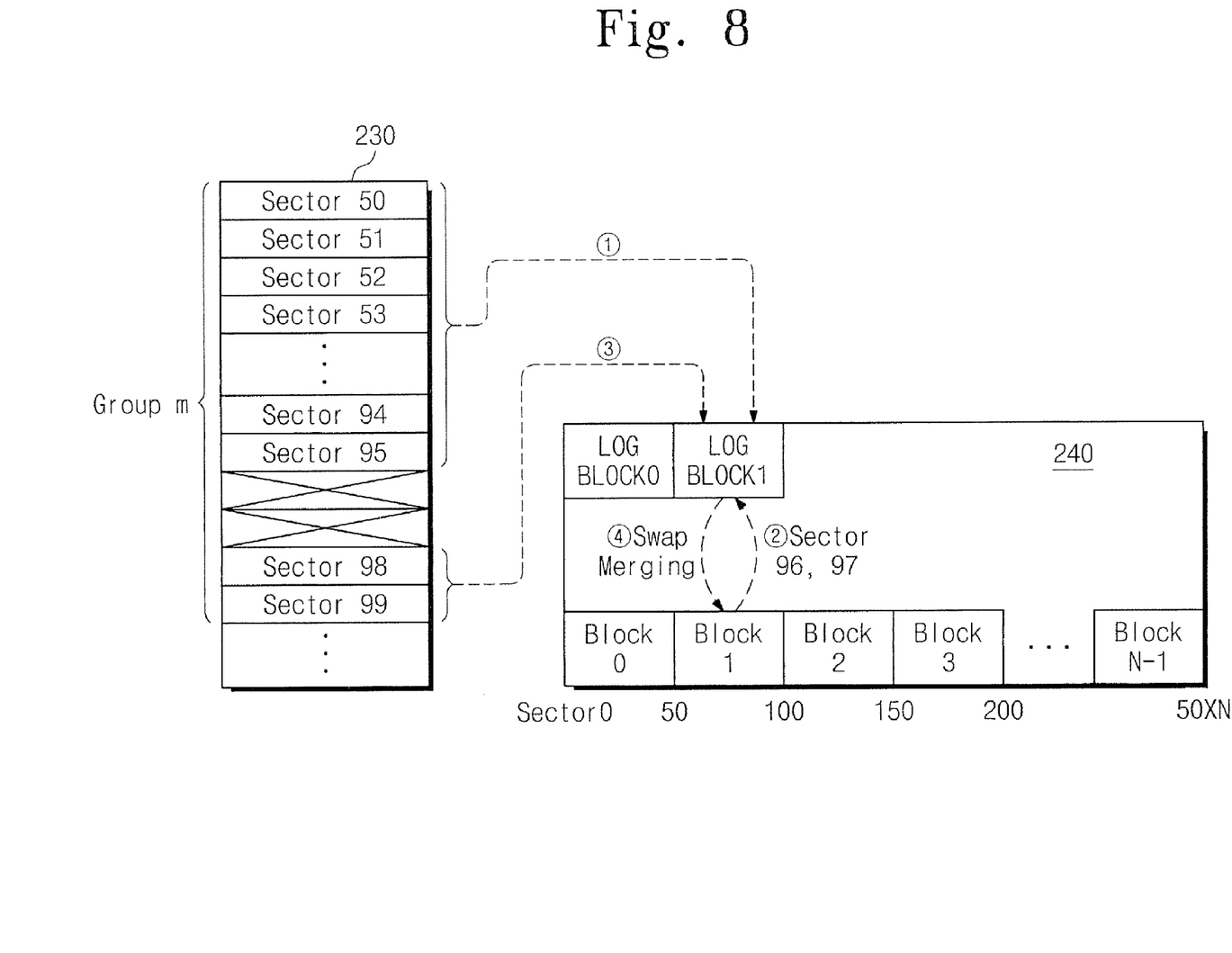
FIG. 8 is a diagram illustrating a swap merge operation based on the groups of FIG. 7.

FIG. 8 is a diagram illustrating a swap merge operation that may be applied to any of the groups of FIG. 7. Referring to FIG. 8, there is illustrated a method of switching a log block into a data block after the transfer of flush data based on the data blocks to which the log blocks are currently allotted. That is, a swap merge operation may be performed where one memory block unit is configured by combining data stored in a data block corresponding to a current log block with a sector group to be flushed, as described in greater detail below.

In FIG. 8, a sector group Groupm grouped by the FTL 225 includes sectors 50 to 95 and 98 and 99, and sectors 96 and 97 not included in the sector group Groupm have been previously recorded in a data block Block1. The FTL 225 first records sectors 50 to 95 in a log block LOG BLOCK1 allotted to a data block Block1 (①). The FTL 225 transfers sectors 96 and 97 to the log block LOG BLOCK1 from a data block Block1 to which the log block LOG BLOCK1 is allotted (②). The FTL 225 transfers sectors 98 and 99 of the sector group Groupm into the log block LOG BLOCK1 (③). Accordingly, all sectors corresponding to the same target block are programmed in a log block LOG BLOCK1 where sectors 98 and 99 are programmed. Thus, a swap merge operation is performed where an address of a log block LOG BLOCK1 is assigned to a data block Block1 without an additional merge operation (④).

In accordance with the above-described swap merge operation, a merge operation is conducted by modifying an address, not transferring data from a log block to a data block. Thus, a time needed for a data transfer may be reduced using a swap merge operation according to some embodiments.

Figure 9:
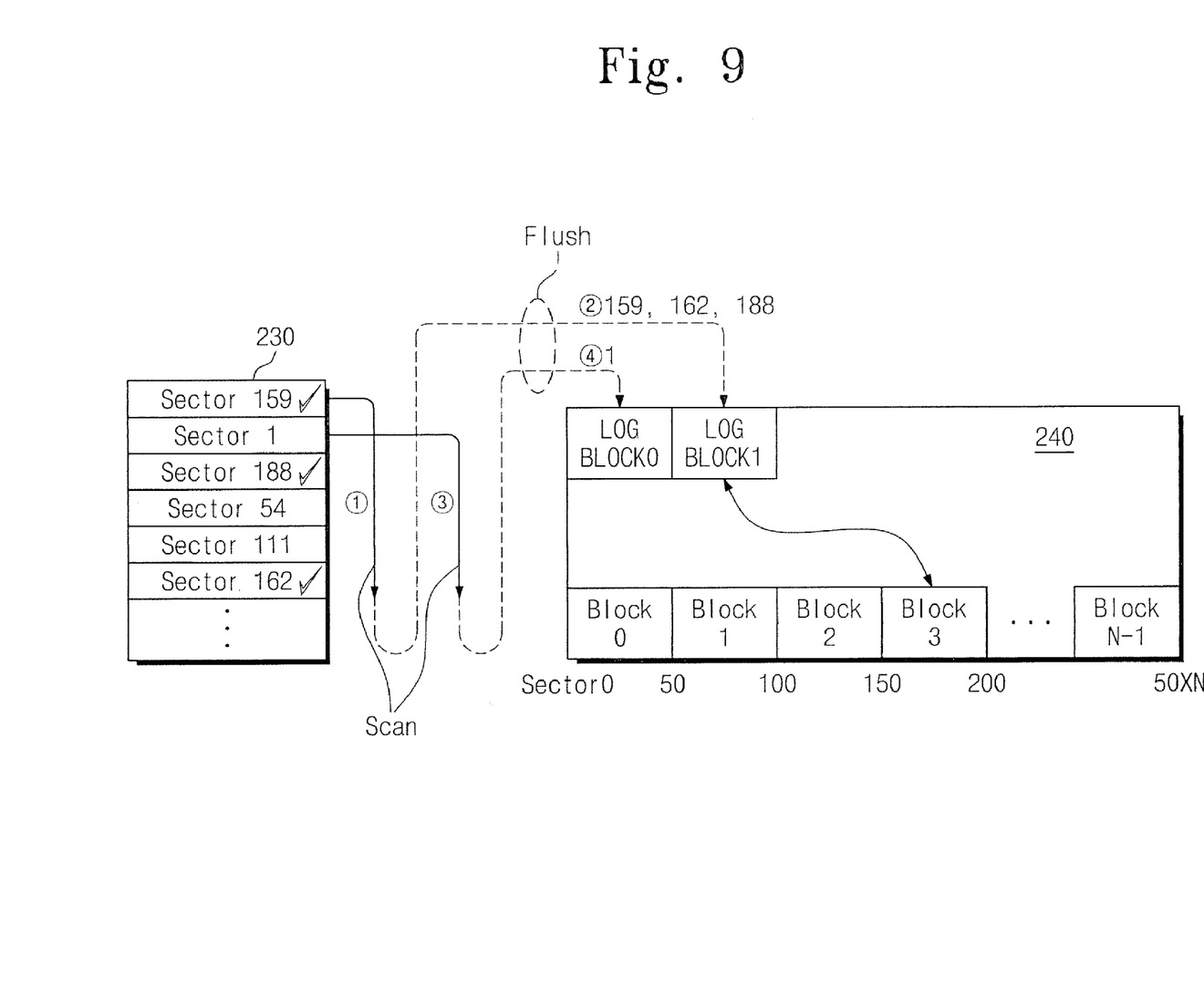
FIG. 9 is a diagram illustrating a flush method according to other embodiments.

FIG. 9 is a diagram illustrating a flush method according to some other embodiments. Referring to FIG. 9, grouping of sector data buffered in the first non-volatile memory 230 and/or granting of a priority via rearranging may not be performed. Instead, sectors included in the same group as a selected sector for flushing are scanned in a FIFO manner when a flush operation is executed. Sectors included in the same group as a sector to be flushed are selected and sequentially flushed according to the scanning operation. Thus, the number of additional merge operations performed to obtain a log block may be reduced, as further described in detail below.

First, if the first non-volatile memory 230 does not have free memory or a remaining data region, a data flush operation is conducted. Sector 159 is flushed first, according to the order in which sectors were programmed in the first non-volatile memory 230. Prior to shifting sector 159, it is determined whether additional sectors to be flushed are included in the same group as sector 159. That is, the sectors to be flushed are scanned for sectors having sector numbers 150 to 199 (①). Sectors 188 and 162 are identified as a result of the scan, and are transferred to a log block LOG BLOCK1, which is allotted to or associated with a data block Block3 (②). When sector 1 is transferred, the remaining sectors to be flushed are scanned for sectors of the same group as the sector 1. That is, the sectors to be flushed are scanned for sectors having sector numbers 0 to 49 (③). Since no sectors of the same group as the sector 1 are present, sector 1 is programmed in an allotted log block LOG BLOCK0 (④). As described above, sectors to be flushed are scanned at a flush point of time, and sectors in the same group are transferred to a log block of the second non-volatile memory 240 prior to remaining sectors.

Although the operations of FIG. 9 are not specifically described with reference to a device for performing the above-described scanning operation, it will be understood that the above-described operations may be performed by any of the devices described herein as shown in FIGS. 1, 2, and 6, such as a memory controller 220 of a memory card 250 and/or a host driver 120 of a host 110.

Figure 10:
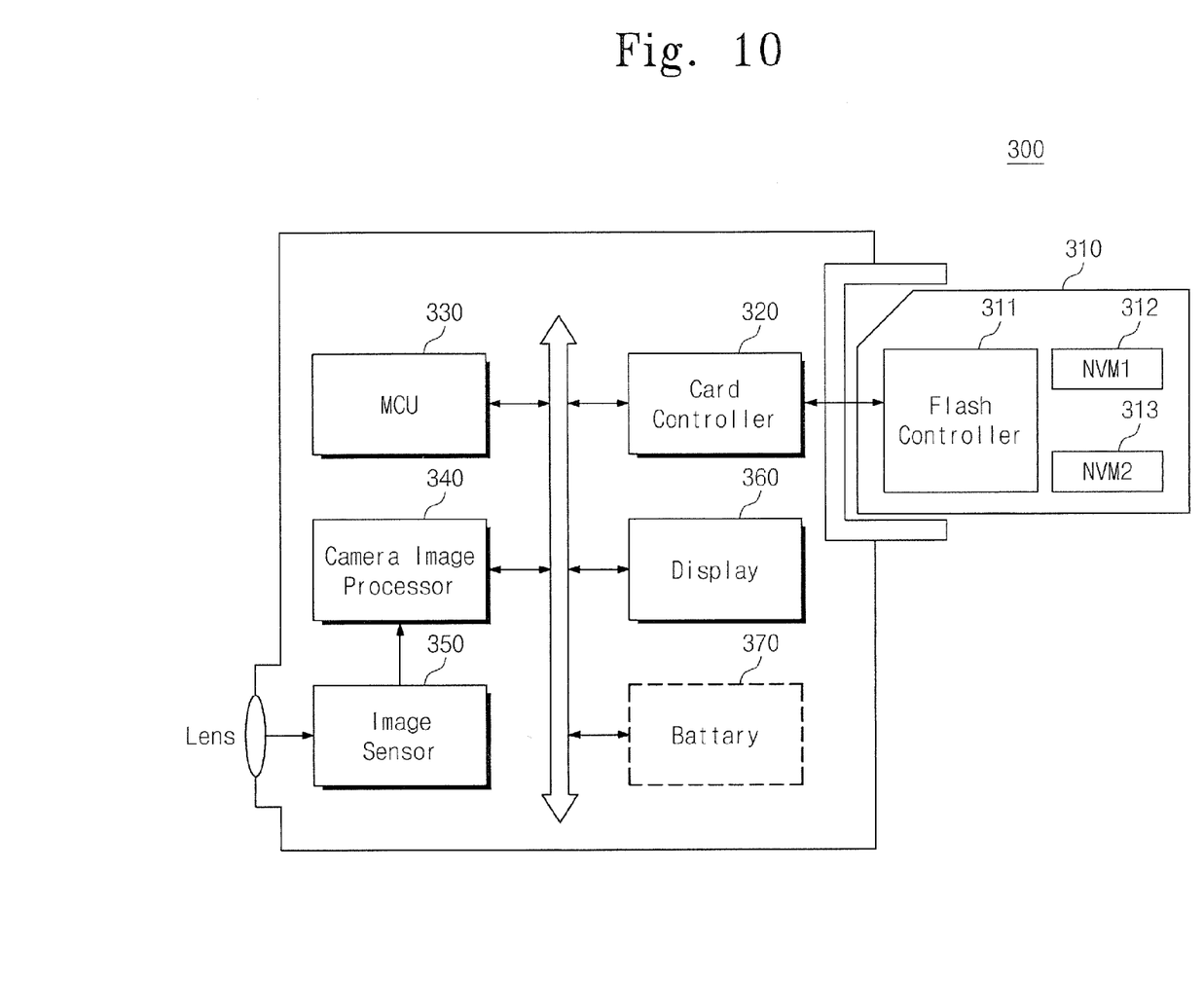
FIG. 10 is a block diagram illustrating an electronic apparatus according to some embodiments.

FIG. 10 is a block diagram illustrating an electronic apparatus according to some embodiments. The electronic apparatus may be, for example, a digital camera. Referring to FIG. 10, the digital camera 300 may include a memory card 310. The digital camera 300 according to the exemplary embodiments may include the memory card 310, which includes the first and second non-volatile memories 312 and 313 for data storage. The digital camera 300 includes a card controller 320 for interfacing with the memory card 310. The digital camera 300 further includes MCU 330 and a camera image processor 340, which are electrically connected to a bus. The camera image processor 340 processes an image signal provided from an image sensor 350, which senses an optical image from a lens. The digital camera 300 further includes a display 360, which processes an image signal to provide a visual image. A battery 370 may also be provided to provide power to the digital camera 300. Although not illustrated in the figures, it will be understood that systems according to the embodiments may further include application chipsets, mobile DRAM, and the like.

The memory card 310 according to the embodiment of FIG. 10 may be a MMC card, SD card, micro SD card, memory stick, ID card, PCMCIA card, chip card, USB card, smart card, CF card, or the like.

The non-volatile memories 312 and 313 are configured to retain data stored therein even when powered-off. The non-volatile memories 312 and 313 may be widely used as data storage and/or code storage in mobile devices such as cellular phones, PDAs, digital cameras, portable game consoles, and/or MP3 players. The memory card 310 including the non-volatile memories 312 and 313 and a flash controller 311 may also be used in home applications such as HDTV, DVD, router, and/or GPS devices.

A memory card as described herein may also be embodied in a system. The embodied system may be a computing system included as a part of other devices and, may perform specific computing operations as required by a device included in the system, unlike a general purpose computer. Such a system may also include an operating system having a central processing unit, and may execute an application via the operating system to perform a specific function. In general, the system may be configured to control electronic devices such as military devices, industrial devices, communication devices, set top boxes, DTVs and/or, digital cameras.

The above-disclosed subject matter is to be considered illustrative, and not restrictive, and the appended claims are intended to cover all such modifications, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

That which is claimed:

1. A method of managing data in a memory system including a first non-volatile memory and a second non-volatile memory, the method comprising:
programming data in the first non-volatile memory by a predetermined unit; and
flushing a plurality of data programmed in the first non-volatile memory into at least one log block of the second non-volatile memory in a group-by-group manner according to a flush sequence that is different from a buffering sequence thereof in the first non-volatile memory, wherein units of the plurality of data are assigned to at least two different groups having different respective flush priorities such that units of the plurality of data assigned to one of the different groups having a higher flush priority are transferred to the second non-volatile memory prior to units of the plurality of data assigned to one of the different groups having a lower flush priority, wherein at least one of the different groups has at least two units of the plurality of data assigned thereto, and
wherein each of the units of the plurality of data included in a same group has a respective priority associated therewith according to a logical sector number thereof such that units of the plurality of data having a lower logical sector number are transferred first among the units of the plurality of data included in the same group.

2. The method of claim 1, wherein the plurality of data comprises a plurality of sector data, and wherein one or more units of the plurality of sector data is included in one of the different groups according to a logical sector number thereof.

3. The method of claim 2, wherein units of the plurality of sector data included in a same group comprise sector data having logical sector numbers corresponding to a same data block of the second memory.

4. The method of claim 1 wherein the respective flush priorities of the different groups in the flush sequence are determined according to how many units of the plurality of data are included in each of the different groups.

5. The method of claim 1, wherein a respective flush priority of at least one of the different groups in the flush sequence is further determined according to a data block of the second memory to which the at least one log block is assigned at a time that the respective flush priority is determined.

6. The method of claim 5, wherein a group including at least one of the plurality of data having a logical sector number corresponding to the data block of the second memory comprises a highest priority in the flushing sequence and is flushed first into the second memory.

7. A data flushing method in a non-volatile memory system which transfers a plurality of sector data buffered in a first non-volatile memory into a second non-volatile memory, the method comprising:

selecting a unit of the plurality of sector data for transfer to the second non-volatile memory;

detecting at least an additional unit of the plurality of sector data having a same target block of the second memory as the selected unit of the plurality of sector data; and sequentially shifting the selected and detected units of the plurality of sector data into a log block of the second non-volatile memory that is assigned to the target block, prior to shifting remaining units of the plurality of sector data, in a sequence different from a buffering sequence thereof in the first non-volatile memory such that sector data having a lower logical sector number among the selected and detected units of the plurality of sector data is shifted first.

8. The data flushing method of claim 7, wherein the steps of selecting, detecting, and shifting are repeated until the plurality of sector data buffered in the first non-volatile memory is transferred into the second non-volatile memory.

9. An information processing system comprising:
a first non-volatile memory that is configured to sequentially store data provided from a host device in a buffering sequence by a predetermined unit;
a second non-volatile memory that is configured to store a plurality of data transferred thereto from the first memory; and
a controller that is configured to provide an interface between the host device and the first and second non-volatile memories and flush the plurality of data from the first non-volatile memory into the second non-volatile memory in a group-by-group manner according to a flush sequence that is different from the buffering sequence in the first non-volatile memory, wherein units of the plurality of data are assigned to at least two different groups having different respective flush priorities, wherein units of the plurality of data assigned to one of the different groups having a higher flush priority are transferred to the second non-volatile memory prior to units of the plurality of data assigned to one of the different groups having a lower flush priority, wherein at least one of the different groups has at least two units of the plurality of data assigned thereto,
wherein each of the units of the plurality of data included in a same group has a respective priority associated therewith according to a logical sector number thereof such that units of the plurality of data having a lower logical sector number are transferred first among the units of the plurality of data included in the same group.

10. The information processing system of claim 9, wherein the first and second memories are included in a non-volatile memory system.

11. The information processing system of claim 10, wherein data in the second memory is managed according to a log block mapping method, and wherein the controller is configured to flush the plurality of data into at least one log block of the second memory.

12. The information processing system of claim 11, wherein ones of the plurality of data are assigned to the different groups according to a data block size of the second memory.

13. The information processing system of claim 12, wherein, of the different groups, a group including a greater number of the units of the plurality of data has a higher flush priority in the flush sequenced.

14. The information processing system of claim 12, wherein, of the different groups, a group including at least one of the plurality of data having a logical sector number corresponding to a data block of the second memory to which the at least one log block of the second memory is assigned comprises a highest priority in the flushing sequence, and is flushed first by the controller.

15. The information processing system of claim 14, wherein a group including a greater number of the units of the plurality of data has a lower flush priority in the flush sequence.

16. The information processing system of claim 10, wherein the controller comprises a host driver that is configured to assign the units of the plurality of data into the different groups having the respective flush priorities.

17. The information processing system of claim 10, wherein the controller comprises a memory controller including a flash translation layer that is configured to assign the units of the plurality of data into the different groups having the respective flush priorities.

18. The information processing system of claim 17, wherein the flash translation layer determines a respective flush priority of at least one of the different groups according to a data block of the second memory to which the at least one log block of the second memory is assigned at a time that the respective flush priority is determined by the flash translation layer.

* * * * *